(12) United States Patent
Nieh et al.

(10) Patent No.: US 11,489,523 B2
(45) Date of Patent: Nov. 1, 2022

(54) TOUCH CONTROL HUMAN MACHINE INTERFACE

(71) Applicants: DEFOND ELECTECH CO., LTD, Guangdong (CN); DEFOND COMPONENTS LIMITED, Chai Wan (HK)

(72) Inventors: Cheng Chen Nieh, Chai Wan (HK); Kai Kei Poon, Chai Wan (HK); Yiu Cho Yuen, Chai Wan (HK)

(73) Assignees: DEFOND ELECTECH CO., LTD., Guangdong (CN); DEFOND COMPONENTS LIMITED, Chai Wan (HK)

( * ) Notice: Subject to any disclaimer, the term of this patent is extended or adjusted under 35 U.S.C. 154(b) by 0 days.

(21) Appl. No.: 16/682,561

(22) Filed: Nov. 13, 2019

(65) Prior Publication Data

US 2020/0228118 A1 Jul. 16, 2020

(30) Foreign Application Priority Data

Nov. 13, 2018 (HK) .................... 18114489.9

(51) Int. Cl.
*H03K 17/96* (2006.01)
*G06F 3/02* (2006.01)
(Continued)

(52) U.S. Cl.
CPC ....... *H03K 17/9622* (2013.01); *G06F 3/0202* (2013.01); *G06F 3/044* (2013.01); *G06F 3/0481* (2013.01); *H03K 2217/960785* (2013.01)

(58) Field of Classification Search
CPC ... H03K 17/9622; H03K 2217/960785; H03K 2217/96015; H03K 2217/9653;
(Continued)

(56) References Cited

U.S. PATENT DOCUMENTS 8,587,600 B1 * 11/2013 Tischler ................. G09G 5/363
345/557
9,852,854 B1 * 12/2017 Wang ..................... H01H 13/06
(Continued)

FOREIGN PATENT DOCUMENTS

CN 201716711 U 1/2011
CN 102314256 A 1/2012
(Continued)

OTHER PUBLICATIONS

Chinese Patentability Search Report dated Dec. 10, 2018, for HK Application Serial No. 18114489.9 filed Nov. 13, 2018.
(Continued)

*Primary Examiner* — Sahlu Okebato
(74) *Attorney, Agent, or Firm* — Bryan D. Zerhusen; Nicholas R. Herrel; Cantor Colburn LLP

(57) ABSTRACT

A touch control human-machine interface for use in controlling operation of a machine, said interface including: an interface housing; a cover plate disposed on an outer-surface of the housing, said cover plate having a first electrically-conductive portion configured for touch interaction by a user's finger; a circuit assembly disposed within the housing, said circuit assembly including a circuit board having a second electrically-conductive portion and a light illumination module operably-connected thereto; a spacer element disposed between and separating the first conductive portion from the second conductive portion such that the first conductive portion, the second conductive portion and the spacer element are configured to form a capacitor device that is operably-connected with the circuit assembly; said first electrically-conductive portion being configured for deformation by the user's finger so as to cause a change in capacitance across the capacitor device, and whereby responsive to said change in capacitance, the circuit assembly is configured for generating a control signal for control- (Continued)

ling operation of the machine, and, for controlling the light illumination module to propagate a light emission from the circuit assembly through the housing and cover plate so as to be visible externally of the housing.

6 Claims, 3 Drawing Sheets

(51) Int. Cl.
*G06F 3/044* (2006.01)
*G06F 3/0481* (2022.01)

(58) Field of Classification Search
CPC ....... H03K 17/98; G06F 3/0202; G06F 3/044; G06F 3/0481
See application file for complete search history.

(56) References Cited

U.S. PATENT DOCUMENTS

| | | | |
|---|---|---|---|
| 10,347,443 B1* | 7/2019 | Wu | G02B 6/0023 |
| 2010/0084253 A1 | 4/2010 | Bollman et al. | |
| 2011/0037624 A1 | 2/2011 | Pance et al. | |
| 2014/0166462 A1* | 6/2014 | Jonely | H03K 17/962 |
| | | | 200/600 |
| 2016/0156352 A1 | 6/2016 | Ziv | |

FOREIGN PATENT DOCUMENTS

| | | | | |
|---|---|---|---|---|
| CN | 202870789 U | 4/2013 | | |
| WO | WO-03050671 A2 * | 6/2003 | ........... | G06F 3/0446 |

OTHER PUBLICATIONS

Extended European Search Report for EP 19208508.2-1216, dated Apr. 15, 2020.

* cited by examiner

TOUCH CONTROL HUMAN MACHINE INTERFACE

CROSS-REFERENCE TO RELATED APPLICATION

The present Application claims the benefit of Hong Kong Patent Application No. 18114489.9, titled: A Touch Control Human Machine Interface, filed on 13 Nov. 2018, the contents of which are incorporated herein by reference.

BACKGROUND

Field. The present invention relates to capacitive touch sensor human-machine control interfaces for use in controlling operation of an electrical appliance.

Background Capacitive touch sensors are used as a control input in human-machine interfaces (HMIs) of machines such as cash registers, mobile telephones, and calculators whereby, in response to depression of control buttons on a key sheet of the HMI, changes in capacitance across the capacitive sensors may be read by control circuitry of the HMI for use in controlling operation of the machine. There is a perceived need for improvements to certain existing capacitive touch sensor HMIs in terms of at least one of the ease of assembly, flexibility and customisability of assembly, the time and cost of manufacture, as well as to the interactive user experience during operation of the HMI.

SUMMARY

The present invention seeks to alleviate at least one of the above-described problems.

The present invention may involve several broad forms. Embodiments of the present invention may include one or any combination of the different broad forms herein described.

In one broad form, the present invention provides a touch control human-machine interface for use in controlling operation of a machine, said interface including: an interface housing; a cover plate disposed on an outer-surface of the housing, said cover plate having a first electrically-conductive portion configured for touch interaction by a user's finger; a circuit assembly disposed within the housing, said circuit assembly including a circuit board having a second electrically-conductive portion and a light illumination module operably-connected thereto; a spacer element disposed between and separating the first conductive portion from the second conductive portion such that the first conductive portion, the second conductive portion and the spacer element are configured to form a capacitor device that is operably-connected with the circuit assembly; said first electrically-conductive portion being configured for deformation by the user's finger so as to cause a change in capacitance across the capacitor device, and whereby responsive to said change in capacitance, the circuit assembly is configured for generating a control signal for controlling operation of the machine, and, for controlling the light illumination module to propagate a light emission from the circuit assembly through the housing and cover plate so as to be visible externally of the housing.

Preferably, the housing may include a portion configured to form a light guide through which the light emission from the light illumination module is propagated from the circuit assembly through the housing and the cover plate.

Preferably, the cover plate may include a light transmissive region, said light transmissive region including at least one of a translucent material, a transparent material, an optical lens, and a cut-out in the cover plate.

Preferably, the light transmissive region may be configured to surround the first conductive portion in the cover plate.

Preferably, the second conductive portion may be integrally formed in the circuit board.

Preferably, the second conductive portion may include a modular component separate from the circuit board that is configured for operable-connection with the circuit board.

Preferably, the housing may be shaped and dimensioned for seating at least one of the second conductive portion and the spacer element.

Preferably, the housing may include a first piece and a second piece that is attachable to the first piece, and whereby said second piece is shaped and dimensioned for seating at least one of the second conductive portion and the spacer element.

Preferably, the second piece may be removably attachable to the first piece.

Preferably, the second piece may be configured for at least one of screw-threaded attachment with the first piece, and, interference-fitting attachment with the first piece.

Preferably, the second piece may be configured for forming an electrical connection between the second conductive portion and the circuit board.

Preferably, the first piece may include a planar array of apertures and wherein one or more second pieces of the housing are configured for selectable attachment with any one of the apertures.

Preferably, the spacer element may include an electrically-insulative material configured for electrically-isolating the first conductive portion from the second conductive portion.

In another broad form, the present invention provides a touch control human-machine interface for use in controlling operation of a machine, said interface including: an interface housing; a cover plate disposed on an outer-surface of the housing, said cover plate having a first electrically-conductive portion configured for touch interaction by a user's finger; a circuit assembly disposed within the housing, said circuit assembly including a circuit board having a modular second electrically-conductive portion operably-connected thereto; a spacer element disposed between and separating the first conductive portion from the second conductive portion such that the first conductive portion, the second conductive portion and the spacer element are configured to form a capacitor device that is operably-connected with the circuit assembly; said first electrically-conductive portion being configured for deformation by the user's finger so as to cause a change in capacitance across the capacitor device, and whereby responsive to said change in capacitance, the circuit assembly is configured for generating a control signal for controlling operation of the machine; and wherein the housing includes a planar array of attachment portions each of which are shaped and dimensioned for selectably seating at least one of the second conductive portion and the spacer element therein.

Preferably, the planar array of attachment portions may include a planar array of apertures.

Preferably, the planar array of apertures may be disposed in a first piece of the housing, and wherein the housing includes at least one second piece which is selectably attachable to any one of the apertures in the planar array of apertures, and wherein said second piece is shaped and dimensioned for seating at least one of the second conductive portion and the spacer element.

Preferably, the second piece may be configured for at least one of screw-threaded attachment and interference-fitting attachment with at least one of the apertures in the planar array of apertures.

Preferably, the second piece may be configured for forming an electrical connection between the second conductive portion and the circuit board.

Preferably, the circuit assembly may include a light illumination module operably-connected to the circuit board that is configured for propagating a light emission from the circuit assembly through the housing and cover plate so as to be visible externally of the housing.

Preferably, the housing may include a portion configured to form a light guide through which the light emission from the light illumination module is propagated from the circuit assembly through the housing and cover plate.

Preferably, the light guide may be formed in the second piece of the housing.

Preferably, the cover plate may include a light transmissive region, said light transmissive region including at least one of a translucent material, a transparent material, an optical lens, and a cut-out in the cover plate.

Preferably, the light transmissive region may be configured to surround the first conductive portion in the cover plate.

Preferably, the spacer element may include an electrically-insulative material configured for electrically-isolating the first conductive portion from the second conductive portion.

BRIEF DESCRIPTION OF THE DRAWINGS

The present invention will become more fully understood from the following detailed description of a preferred but non-limiting embodiment thereof, described in connection with the accompanying drawings, wherein.

DETAILED DESCRIPTION

Figure 1:
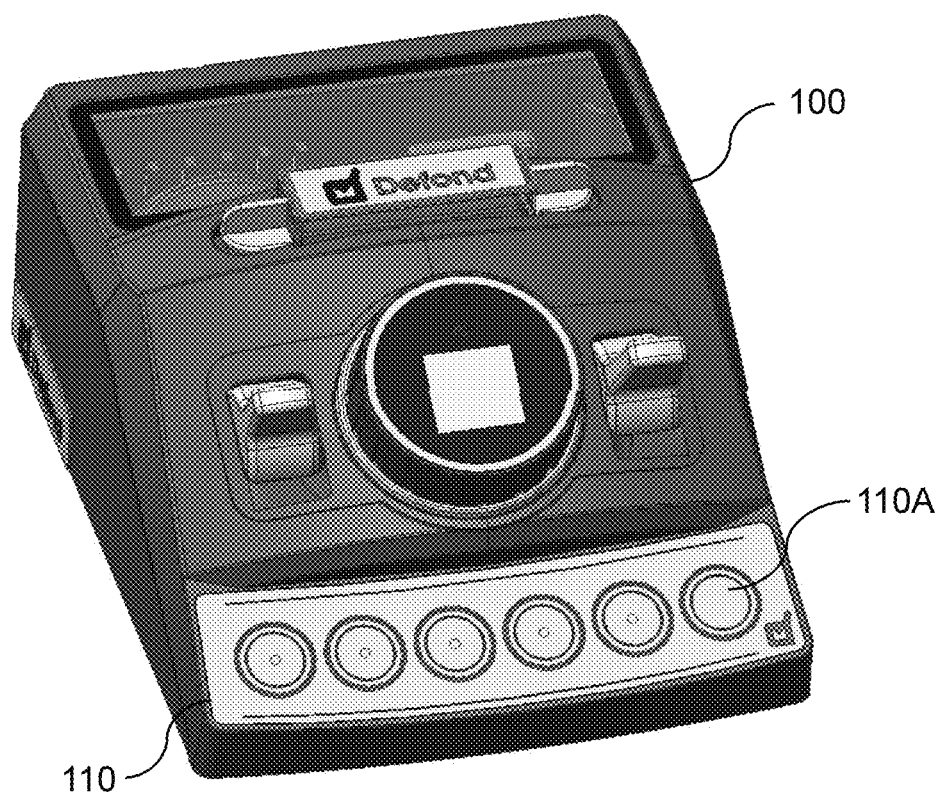
FIG. 1 shows an exemplary machine having a touch control human machine interface disposed thereon for use in controlling the machine.

Preferred embodiments of the present invention in the form of a touch control human machine interface (HMI) for use in controlling a machine will now be described herein with reference to FIGS. 1 to 3. FIG. 1 depicts an example of a machine (100) having an HMI device (110) comprising a plurality of touch-input buttons (110A) disposed thereon.

Figure 2:
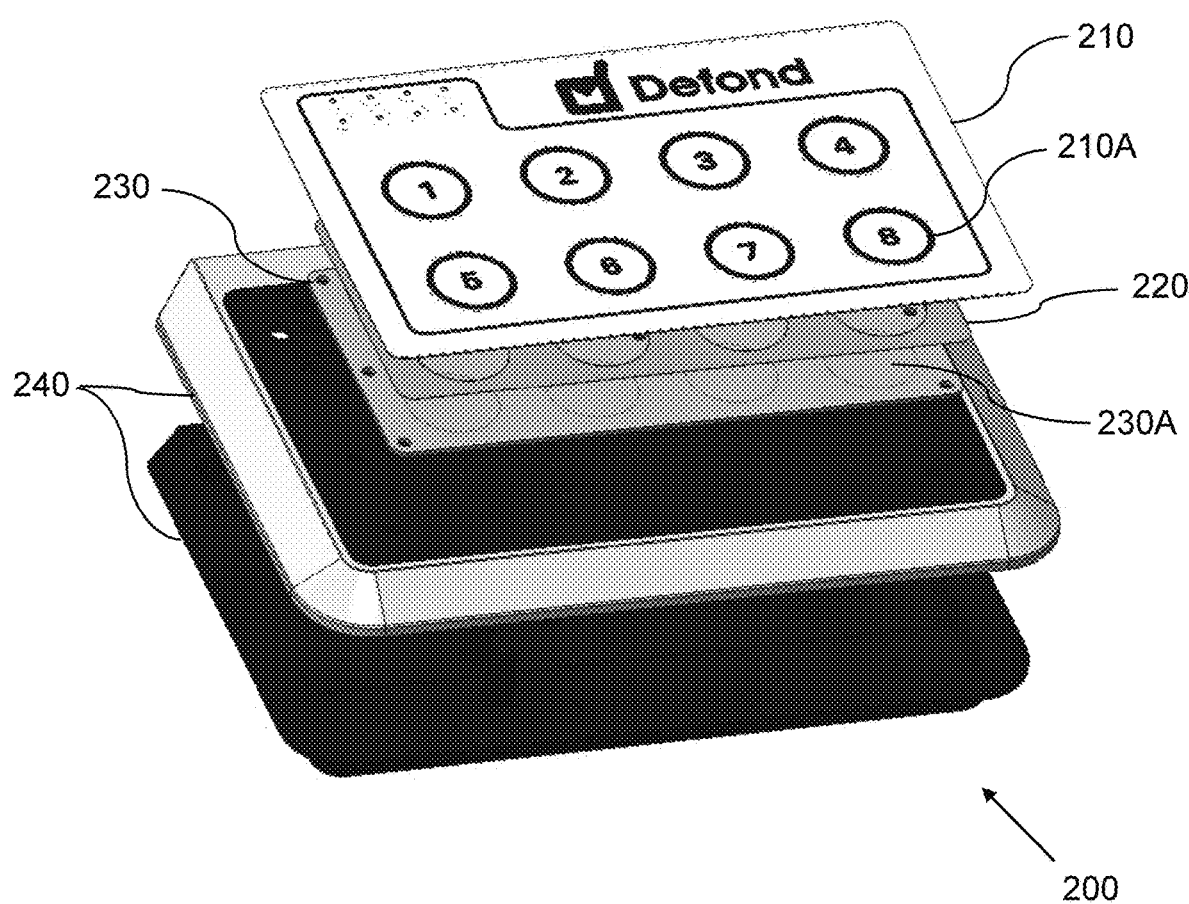
FIG. 2 shows an exploded-view of an existing touch-control human machine interface architecture.

FIG. 2 shows an exploded-view of an existing HMI device (110) that is used to provide touch-input control of a machine such as that shown in FIG. 1. The existing HMI architecture includes a cover plate (210) having a plurality of circular-shaped electrically-separated first electrically-conductive portions (210A) numbered 1 to 8 in the FIG. 2. The HMI (200) further includes a circuit assembly (230) disposed on a circuit board (230) that is disposed within a two-piece housing (240) of the HMI as shown. The circuit assembly (230) is configured for processing user inputs received in to the HMI (200), and for generating control signals in response to the received inputs for use in controlling various functions of the machine (for instance, heat control, speed control etc.). The circuit assembly (230) includes a plurality of annular-shaped second electrically-conductive portions (230A) disposed on the circuit board (230) each of which corresponds uniquely with one of the first electrically-conductive portions (210A) of the cover plate (210). A spacer element (220) is disposed between the cover plate (210) and the circuit board (230) so as to physically and electrically space apart each of the first electrically-conductive portions (210A) and their corresponding second electrically-conductive portions (230A). The resulting configuration gives rise to a plurality of capacitive devices each of which are operably-connected with an input port of the circuit assembly (230). The first electrically-conductive portions (210A) are thus able to serve as the buttons for the HMI (200) which when suitably elastically depressed by a user's finger, changes the capacitance in the respective capacitive devices, and allows for a range of different signal inputs to be sensed by the circuit assembly (230) to control the operation of the machine. The cover plate (210) may typically be formed of a metallic material of a material having metallic properties. By way of example the cover plate (210) may comprise a stainless-steel plate of approximately 0.4 mm thickness which provides a flat durable surface that is easy to maintain and to clean. The spacer element (220) in this example existing architecture includes a sheet having plurality of circular-shaped cut-outs matching the dimensions of the first and second electrically-conductive portions (210A,230A) so that a safety gap is provided between the spaced-apart first and second electrically-conductive portions (210A,230A) as shown in FIG. 2. The thickness of the spacer element (220) is selected such that it suitably spaces apart and prevents contact between the cover plate (210) and the circuit assembly (230) when the cover plate (210) is depressed.

Having described the general principles of operation of an existing HMI, we now turn to FIG. 3 which depicts an exploded-view of a preferred embodiment of the present invention which may assist in providing novel improvements and advantages over the existing technology the operation of which as will be described in detail below.

Figure 3:
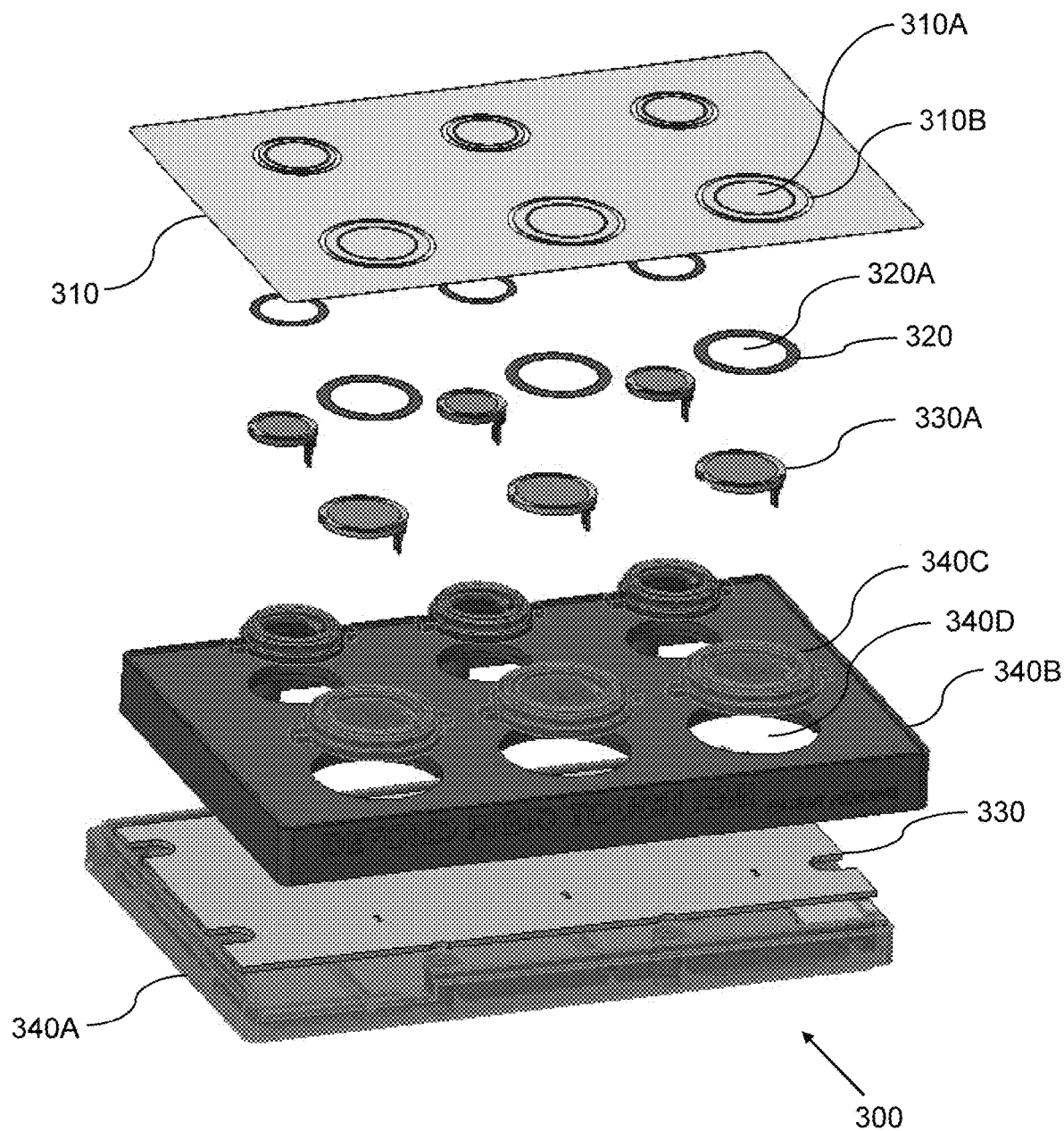
FIG. 3 shows an exploded-view of a touch-control human machine interface architecture in accordance with an embodiment of the present invention.

In the preferred embodiment of FIG. 3, the HMI (300) includes an interface housing (340A,340B,340C), a stainless steel cover plate (310) of approximately 0.4 mm thickness disposed on an outer-surface of the housing (340A,340B, 340C). The cover plate (310) includes a plurality of first electrically-conductive portions (310A) that are configured for touch interaction by a user's finger. A circuit assembly is disposed within the housing and includes an input/output module and processor module operably-connected in the circuit board (330), and a plurality of second electrically-conductive portions. A plurality of spacer elements (320) are disposed between and separates each of the first electrically-conductive portions (310A) from the respective second electrically-conductive portions (330A) such that the first electrically-conductive portions (310A) and their corresponding second electrically-conductive portions (330A) and the respective spacer elements (320) form a plurality of capacitive devices that are operably-connected with an input port of the circuit assembly (330) via suitable wiring or interconnections in the housing (340A,340B,340C). The spacer elements (320) are configured such that when positioned between the cover plate (310) and the circuit board (330), the spacer elements are shaped and dimensioned so that circular-shaped apertures (320A) in the spacer elements (320) having similar shape and dimensions to the first and second electrically-conductive portions (310A,330A) are positioned between respective first and second electrically-conductive portions (310A,330A). In alternate embodiments, the spacer elements may not include apertures but may be comprised by solid material (for instance a sponge-like material) having electrically-insulative properties and which may suitably configured for compression when the first electrically-conductive portions are depressed inwardly of the housing towards the second electrically-conductive portions.

Further, in contrast to the existing device architecture shown in FIG. 2, in this preferred embodiment, the second electrically-conductive portions (330A) are comprised by a plurality of modular electrically-conductive portions (330A) which may each be selectably positioned within the housing (340A,340B,340C) to form capacitive devices with respective spacer elements (320) and respective first electrically-conductive portions (310A) of the cover plate. Similarly, in this preferred embodiment, the spacer elements (320) are comprised by a plurality of modular spacer elements (320) that are configured for arrangement individually between respective pairs of first and second electrically-conductive portions (310A,330A). Yet further, in this embodiment, the HMI housing (340A,340B,340C) is shaped and dimensioned for seating the modular second electrically-conductive portions (330A) and respective modular spacer elements (320) in relative position with respective first electrically-conductive portions (310A) to form the plurality of capacitive devices. Yet further, in this embodiment, the housing (340A,340B,340C) includes a first piece (340B) and a plurality of second pieces (340C) that are attachable to the second piece (340C) as shown in FIG. 3. A third piece (340A) of the housing provides a base upon which the circuit board (330) is mounted. The first piece (340B) comprises a planar array of annular-apertures (340D) that are configured for positioning between the circuit assembly circuit board (330) and the cover plate (310). Although FIG. 3 depicts the first piece (340B) comprising a 2×3 planar array of annular-apertures (340D), any n×n array configuration may be utilised in alternate embodiments. The plurality of second pieces (340C) of the housing comprises modular annular-shaped pieces that are configured for either screw-threaded engagement or interference-fitting engagement within each of the annular-shaped apertures (340D) of the first piece (340B). Each of the modular second pieces (340C) of the housing are shaped and dimensioned to provide for secure seating of a modular second electrically-conductive portion (330A) and its respective modular spacer element (320). Although in this preferred embodiment the housing is described as comprising a first piece and a plurality of second pieces, in alternate embodiments it may be possible that the second pieces are integrally formed together with the first piece.

In contrast to the existing HMI architecture of FIG. 2. comprising a fixed single-piece spacer element and second electrically-conductive portions integrally formed in fixed positions on the circuit board, the modular nature of the preferred embodiment allows the user to flexibility and easily select the positions of the modular second electrically-conductive portions and respective modular spacer elements within the planar array of apertures of the housing so that the circuit assembly may define the input pattern of the cover plate buttons. Advantageously, this may also assist in alleviating the cost of manufacture and assembly of the HMI device as the user may attach only as many modular second electrically-conductive portions and modular spacer elements as is required to match the number of input buttons disposed on the cover plate without wastage. Yet further, by virtue of the modular nature of the preferred embodiment, faulty components may be selectably removed and replaced during assembly or maintenance, in contrast to the existing HMI architecture of FIG. 2 in which the entire spacer element and circuit board must be replaced in the event of damage. Yet further, it may be possible for the various modular components of the HMI device to be pre-assembled together, calibrated and tested at different assembly locations, before final assembly in the HMI device.

In this preferred embodiment the circuit assembly also includes at least one light illumination module (not shown) and preferably a plurality of light illumination modules that are configured for propagating a light emission from the circuit board (330) through the housing (340A,340B,340C) and through the cover plate (310) to serve as a light indicator whenever a button (310A) of the HMI (300) has been depressed. In this embodiment, the light illumination module includes a plurality of LEDs which may be mounted on the circuit board. In contrast to the existing HMI device shown in FIG. 2 the cover plate (310) is configured to include a plurality of light transmissive regions (310B) at least partially surrounding each of the first electrically-conductive portions (310A) on the cover plate (310) which allows the light emissions from the LEDs to pass therethrough so as to be visible externally of the HMI housing. The light transmissive regions (310B) in this embodiment are embodied by optical lens material which may assists in transmission of the emitted light outwardly of the housing (340A,340B,340C) to meet a desired light emission effect of the user. In alternate embodiments, it the light transmissive regions (310B) may not necessarily be comprised by lens material but may instead comprise any suitably translucent or transparent material, or, may simply comprise cut-out portions in the cover plate (310) surrounding or otherwise in proximity to the first electrically-conductive portions (310). Yet further in this embodiment, the first and second pieces (340B,340C) of the housing are suitably configured to act as a light guide through which the light emissions from the light illumination modules are propagated from the circuit board (330) through the housing and the through the light-transmissive regions (310B) of the cover plate (310). Advantageously, the addition of the novel light indicator assembly in this preferred embodiment may assist in providing for an improved user experience through improved visibility of operation of the HMI interface (300) as well as providing a more aesthetically pleasing appearance.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. A touch control human-machine interface for use in controlling operation of a machine, said interface including:
   an interface housing;
   a cover plate disposed on an outer-surface of the housing, said cover plate having a plurality of first electrically-conductive portions configured for touch interaction by a user's finger, and a plurality of light transmissive regions surrounding the plurality of first electrically-conductive portions, said light transmissive regions being formed in co-planar arrangement with the plurality of first electrically-conductive portions in the cover plate;

a circuit assembly disposed within the housing, said circuit assembly including a circuit board having a plurality of second electrically-conductive portions and a light illumination module operably-connected thereto, the plurality of second conductive portions being modular components that are separate from the circuit board and which are configured for operable-connection with the circuit board;

at least one spacer element disposed between and separating the plurality of first conductive portions from the plurality of second conductive portions such that the plurality of first conductive portions, the plurality of second conductive portions and the at least one spacer element are configured to form a plurality of capacitors device that are operably connected with the circuit assembly;

said plurality of first electrically-conductive portions being configured for deformation by the user's finger such that the deformation of the first electrically-conductive portions cause changes in capacitance across the plurality of capacitor devices, and whereby responsive to said changes in capacitance, the circuit assembly is configured for generating a control signal for controlling operation of the machine, and, for controlling the light illumination module to propagate a light emission from the circuit assembly through the housing and the plurality of light transmissive regions of the cover plate so as to be visible externally of the housing, wherein the interface housing includes a first piece and a plurality of second pieces, the first piece comprising a planar array of annular apertures that are positioned between the circuit assembly and the cover plate, the plurality of second pieces comprising modular annular-shaped pieces that are configured for engagement within each of the annular-shaped apertures of the first piece, and wherein the modular second pieces of the interface housing are shaped and dimensioned to provide for secure seating of the plurality of modular second conductive portions.

2. The touch control human-machine interface of claim 1, wherein the plurality of light transmissive regions include at least one of a translucent material, a transparent material, an optical lens, and a cut-out in the cover plate.

3. The touch control human-machine interface of claim 2, wherein the plurality of light transmissive regions are configured to surround the plurality of first conductive portions in the cover plate.

4. The touch control human-machine interface of claim 1, wherein the plurality of second pieces are configured for at least one of screw-threaded attachment with the first piece, and, interference-fitting attachment with the first piece.

5. The touch control human-machine interface of claim 1, wherein the plurality of second pieces are configured for forming electrical connections between the plurality of second conductive portions and the circuit board.

6. The touch control human-machine interface of claim 1, wherein the at least one spacer element includes an electrically-insulative material that electrically-isolates the plurality of first conductive portions from the plurality of second conductive portions.

* * * * *